United States Patent
Wu

(10) Patent No.: US 7,522,079 B1
(45) Date of Patent: *Apr. 21, 2009

(54) SIGMA-DELTA MODULATOR WITH DAC RESOLUTION LESS THAN ADC RESOLUTION AND INCREASED TOLERANCE OF NON-IDEAL INTEGRATORS

(75) Inventor: Jian-Yi Wu, San Ramon, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/850,960

(22) Filed: Sep. 6, 2007

(51) Int. Cl.
*H03M 3/00* (2006.01)

(52) U.S. Cl. .................. 341/143; 341/118; 341/120; 341/155

(58) Field of Classification Search ............. 341/118, 341/120, 143, 155
See application file for complete search history.

(56) References Cited

U.S. PATENT DOCUMENTS

| | | | | |
|---|---|---|---|---|
| 5,345,233 | A * | 9/1994 | Nagata et al. ............... | 341/76 |
| 5,369,403 | A * | 11/1994 | Temes et al. ............... | 341/143 |
| 5,442,354 | A * | 8/1995 | Cabler ........................ | 341/143 |
| 5,598,158 | A * | 1/1997 | Linz ........................... | 341/143 |
| 5,646,621 | A * | 7/1997 | Cabler et al. ................ | 341/143 |
| 5,682,161 | A * | 10/1997 | Ribner et al. ............... | 341/143 |
| 6,005,505 | A * | 12/1999 | Linz ........................... | 341/143 |
| 6,313,774 | B1 * | 11/2001 | Zarubinsky et al. ......... | 341/143 |
| 6,570,512 | B1 * | 5/2003 | Hauptmann et al. .......... | 341/77 |
| 6,696,998 | B2 | 2/2004 | Ying et al. | |
| 6,724,322 | B2 * | 4/2004 | Tang et al. .................. | 340/989 |
| 6,920,182 | B2 * | 7/2005 | Bolton, Jr. .................. | 375/247 |
| 6,967,608 | B1 | 11/2005 | Maloberti et al. | |
| 6,980,144 | B1 * | 12/2005 | Maloberti et al. ............ | 341/143 |
| 7,362,247 | B2 * | 4/2008 | Arias et al. .................. | 341/120 |

OTHER PUBLICATIONS

U.S. Appl. No. 11/850,979 by Jian-Yi Wu (Claims 1-7), filed Sep. 6, 2007.*
Leslie, T.C. and Singh, B., "Sigma-Delta Modulators with Multibit Quantising Elements and Single-Bit Feedback", IEE Proceedings-G, vol. 139, No. 3, Jun. 1992, pp. 356-362.
U.S. Appl. No. 11/850,979, entitled "Sigma-Delta Modulator with DAC Resolution Less than ADC Resolution and Increased Dynamic Range", filed Sep. 6, 2007.
U.S. Appl. No. 11/754,442, entitled "Sigma-Delta Modulator with DAC REsolution Less than ADC Resolution", filed May 29, 2007.

* cited by examiner

*Primary Examiner*—Linh V Nguyen
(74) *Attorney, Agent, or Firm*—Vedder Price P.C.

(57) ABSTRACT

A sigma-delta modulator is provided with a feedback digital-to-analog converter having less resolution than the quantizer, while providing a reduced length output word, requiring minimal additional internal processing, and shaping of the truncation error by an effective noise transfer function greater than the order of the host sigma-delta modulator, and further providing increased tolerance of non-ideal integrators.

7 Claims, 6 Drawing Sheets

SIGMA-DELTA MODULATOR WITH DAC RESOLUTION LESS THAN ADC RESOLUTION AND INCREASED TOLERANCE OF NON-IDEAL INTEGRATORS

BACKGROUND OF THE INVENTION

1. Field of the Invention

The present invention relates to sigma-delta modulators, and in particular, to sigma-delta modulators in which the resolution of the feedback digital-to-analog converter (DAC) is less than the resolution of the analog-to-digital converter (ADC) used in the modulator loop.

2. Related Art

Sigma-delta analog-to-digital modulators are often used in a sigma-delta ADC or sigma-delta DAC for providing shaping (filtering) of quantization noise. As the order of the sigma-delta modulator increases, the quantization noise is pushed further away in the frequency band from the signal being converted. Accordingly, sigma-delta ADCs and DACs, as well as their associated modulators, have become widely used in high precision applications.

A key design issue is the choice between a single-bit or a multi-bit quantizer, and in the case of a multi-bit quantizer, the number of bits to be used. With a single bit, the quantizer is binary and interpolation between its two output levels provides a linear response. Accordingly, single-bit architectures are often used since they provide high resolution without requiring accurate analog circuit elements.

However, since the resolution of the sigma-delta modulator relies on the oversampling ratio and the order of the modulator, obtaining a high signal-to-noise ratio (SNR) with relatively large signal bandwidths is problematic since the stability of higher order modulators costs a gain factor in the noise transfer function (NTF) and matching is critical in designing basic circuit blocks for cascaded architectures at high SNRs, e.g., above 90 dB.

A single-bit modulator also has a number of design requirements. Since both signal and quantization noise contribute to the output swing of the integrators, a large quantization step causes a large swing in the output voltage of the operational amplifiers. This requires using a small reference voltage relative to the power supply voltage.

A multi-bit quantizer increases the SNR (i.e., an improvement of SNR of approximately 6 dB for each additional bit). Also, using a multi-bit modulator reduces limits of a single-bit implementation, such as constraints on the reference voltage or demanding slew rate specifications, but does not provide the important characteristic of intrinsic linearity. Since the linearity of the noise-shaping elements depend upon the linearity of the DAC, it is necessary to use well-matched components to provide a DAC with the required linearity. Normally, such matching of integrated components is not adequate for high resolutions (e.g., more than 10-12 bits). Further, with a multi-bit architecture, the input of the downstream digital filter is a high-speed, multi-bit signal that requires complex processing prior to the first decimation. Further still, a multi-bit DAC is more difficult to fabricate in a very large scale integration (VLSI) environment with sufficient linearity needed for the high resolution quantized signal $y_1$ and low resolution (truncated) signal $y_2$.

Referring to FIG. 1, reducing the number of levels, or bits, in the internal DAC of a sigma-delta modulator has been implemented in the form of post-processing of the quantized $y_1$ and truncated $y_2$ signals. In this implementation, represented by its linear model, a classic second order sigma-delta modulator 10 includes adder circuits 12a, 12b, integrators 14a, 14b, a high resolution (i.e., multi-bit) a quantizer 16 (with quantization error $\epsilon_Q$), a truncation circuit 18 (with truncation error $\epsilon_T$), and a feedback DAC 20. A post-processor 22 processes the quantized $y_1$ and truncated $y_2$ signals.

The truncation of the quantized signal $y_1$ adds truncation error $\epsilon_T$ and provides a lower resolution output signal $y_2$. These signals $y_1$, $y_2$ can be expressed as follows:

$$y_1 = p + \epsilon_Q \tag{1}$$

$$y_2 = p + \epsilon_Q + \epsilon_T = p + \epsilon_{QT} \tag{2}$$

The truncated signal $y_2$ is fed back to the adders 12a, 12b. Accordingly, this signal can be expressed as follows (where STF is the signal transfer function and NTF is the noise transfer function):

$$y_2 = x^* \text{STF} + \epsilon_{QT}^* \text{NTF} \tag{3}$$

The analog input signal p to the quantizer 16 can be expressed as follows:

$$p = y_1 - \epsilon_Q = y_2 - \epsilon_{QT} \tag{4}$$

Substituting Equation (4) into Equation (3), the truncated signal $y_2$ can be expressed as follows:

$$y_2 = x^* \text{STF} + (y_2 - y_1 + \epsilon_Q)^* \text{NTF} \tag{5}$$

Rearranging this produces the following expression:

$$y_2^*(1-\text{NTF}) + y_1^*\text{NTF} = x^*\text{STF} + \epsilon_Q^*\text{NTF} \tag{6}$$

Accordingly, it can be seen that signal processing is required to obtain shaping of the quantization error $\epsilon_Q$ instead of the larger truncation error $\epsilon_T$. However, a problem associated with this technique is the post-processing 22 required must be done using a significantly larger number of bits due to the need to process both the quantized $y_1$ and truncated $y_2$ signals.

Other implementations have been proposed in which the digital feedback signal is truncated through a digital sigma-delta modulator that shapes the truncation error. However, since the resulting error is injected at the input of the modulator, its shaping must be of a higher order than the order of the analog modulator. Moreover, the number of bits at the output of the modulator (see, e.g., U.S. Pat. No. 6,980,144, the disclosure of which is incorporated herein by reference) correspond to the resolution of the quantizer, and the first stage of the digital filter used in the decimation is complex as it operates with a long input word. The order of sigma delta modulator used for the truncation must be higher than the order of the modulator as the corresponding error is injected at the input of the quantizer. Therefore, for a second order modulator the truncation must be done by at least a third order scheme with the additional request to have zero delay. This problem is limited by a cancellation of the effect of the truncation error in the analog domain (see, e.g., U.S. Pat. No. 6,967,608, the disclosure of which is incorporated herein by reference). Combining these techniques (e.g., as disclosed in U.S. Pat. Nos. 6,980,144 and 6,967,608) enables the use of a lower order in the truncation generator, although it must still be at least an order of two to ensure suitable shaping and accounting for mismatch between the analog and digital transfer functions used in the cancellation mechanism.

SUMMARY OF THE INVENTION

In accordance with the presently claimed invention, a sigma-delta modulator is provided with a feedback digital-to-analog converter having less resolution than the quantizer, while providing a reduced length output word, requiring minimal additional internal processing, and shaping of the truncation error by an effective noise transfer function greater than the order of the host sigma-delta modulator, and further providing increased tolerance of non-ideal integrators.

In accordance with one embodiment of the presently claimed invention, a multiple order sigma-delta modulator includes: In accordance with another embodiment of the presently claimed invention, a multiple order sigma-delta modulator includes:

an input electrode to convey an analog input signal;

one or more output electrodes to convey one or more digital output signals;

a plurality of analog adder circuits including first and last analog adder circuits, wherein the first analog adder circuit is coupled to the input electrode to receive the analog input signal and a first one of a plurality of analog feedback signals and provide a first one of a plurality of analog added signals, and each remaining one of the plurality of analog adder circuits is to receive a respective upstream one of a plurality of analog integrated signals and a respective additional one of the plurality of analog feedback signals and provide a respective downstream one of the plurality of analog added signals;

a plurality of analog integrator circuits including first and last analog integrator circuits, wherein the first analog integrator circuit is coupled to the first analog adder circuit to receive the first one of the plurality of analog added signals and provide a first one of the plurality of analog integrated signals, and each remaining one of the plurality of analog integrator circuits is coupled to a respective upstream one of the plurality of analog adder circuits to receive a respective upstream one of the plurality of analog added signals and provide a respective downstream one of the plurality of analog integrated signals;

analog-to-digital converter (ADC) circuitry coupled to the last analog integrator circuit to receive a last one of the plurality of analog integrated signals and provide an N-bit digital signal;

a digital adder circuit coupled to the ADC circuitry to receive the N-bit digital signal and a last one of a plurality of digital integrated signals and provide a digital added signal;

an output truncation circuit coupled between the digital adder circuit and the one or more output electrodes to receive the digital added signal and provide the one or more digital output signals including an M-bit digital signal, wherein N>M;

a plurality of feedback truncation circuits coupled to the one or more output electrodes to receive the M-bit digital signal and including first and last feedback truncation circuits to provide first and last ones of a plurality of truncated signals, to provide corresponding first and last ones of a plurality of truncation error feedback signals, and to provide corresponding first and last ones of a plurality of digital feedback signals, having M1 and M2 bits, respectively, wherein $M \geq M1$ and $M \geq M2$, the first one of the plurality of digital feedback signals comprises the first one of the plurality of truncated signals, and each one of the plurality of feedback truncation circuits downstream from the first feedback truncation circuit is further to combine an upstream one of the plurality of digital integrated signals with an associated one of the plurality of truncated signals to provide a respective downstream one of the plurality of digital feedback signals;

a plurality of digital integrator circuits including first and last digital integrator circuits, wherein the first digital integrator circuit is coupled to the first feedback truncation circuit to receive the first one of the plurality of truncation error feedback signals and provide a first one of the plurality of digital integrated signals, and each remaining one of the plurality of digital integrator circuits is coupled to a respective upstream one of the plurality of feedback truncation circuits to receive a respective upstream one of the plurality of truncation error feedback signals and provide a respective downstream one of the plurality of digital integrated signals; and a plurality of digital-to-analog converter (DAC) circuits including first and last DAC circuits to receive the plurality of digital feedback signals and provide the plurality of analog feedback signals.

In accordance with another embodiment of the presently claimed invention, a multiple order sigma-delta modulator includes:

a plurality of analog adder means including first and last analog adder means, wherein the first analog adder means is for adding an analog input signal and a first one of a plurality of analog feedback signals to provide a first one of a plurality of analog added signals, and each remaining one of the plurality of analog adder means is for adding a respective upstream one of a plurality of analog integrated signals and a respective additional one of the plurality of analog feedback signals to provide a respective downstream one of the plurality of analog added signals;

a plurality of analog integrator means including first and last analog integrator means, wherein the first analog integrator means is for integrating the first one of the plurality of analog added signals to provide a first one of the plurality of analog integrated signals, and each remaining one of the plurality of analog integrator means is for integrating a respective upstream one of the plurality of analog added signals to provide a respective downstream one of the plurality of analog integrated signals;

analog-to-digital converter (ADC) means for converting a last one of the plurality of analog integrated signals to provide an N-bit digital signal;

digital adder means for adding the N-bit digital signal and a last one of a plurality of digital integrated signals to provide a digital added signal;

output truncation means for truncating the digital added signal to provide the one or more digital output signals including an M-bit digital signal, wherein N>M;

a plurality of feedback truncation means for truncating the M-bit digital signal and including first and last feedback truncation means for providing first and last ones of a plurality of truncated signals, for providing corresponding first and last ones of a plurality of truncation error feedback signals, and for providing corresponding first and last ones of a plurality of digital feedback signals, having M1 and M2 bits, respectively, wherein $M \geq M1$ and $M \geq M2$, the first one of the plurality of digital feedback signals comprises the first one of the plurality of truncated signals, and each one of the plurality of feedback truncation means downstream from the first feedback truncation means is further for combining an upstream one of the plurality of digital integrated signals with an associated one of the plurality of truncated signals to provide a respective downstream one of the plurality of digital feedback signals;

a plurality of digital integrator means including first and last digital integrator means, wherein the first digital integrator means is for integrating the first one of the plurality of truncation error feedback signals to provide a first one of the plurality of digital integrated signals, and each remaining one of the plurality of digital integrator means is for integrating a respective upstream one of the plurality of truncation error feedback signals to provide a respective downstream one of the plurality of digital integrated signals; and a plurality of digital-to-analog converter (DAC) means including first and last DAC means for converting the plurality of digital feedback signals to provide the plurality of analog feedback signals.

In accordance with another embodiment of the presently claimed invention, a multiple order sigma-delta modulator includes:

an input electrode to convey an analog input signal;

one or more output electrodes to convey one or more digital output signals;

a plurality of analog adder circuits including first and last analog adder circuits, wherein the first analog adder circuit is coupled to the input electrode to receive the analog input signal and a first one of a plurality of analog feedback signals and provide a first one of a plurality of analog added signals, and each remaining one of the plurality of analog adder circuits is to receive a respective upstream one of a plurality of analog integrated signals and a respective additional one of the plurality of analog feedback signals and provide a respective downstream one of the plurality of analog added signals;

a plurality of analog integrator circuits including first and last analog integrator circuits, wherein the first analog integrator circuit is coupled to the first analog adder circuit to receive the first one of the plurality of analog added signals and provide a first one of the plurality of analog integrated signals, and each remaining one of the plurality of analog integrator circuits is coupled to a respective upstream one of the plurality of analog adder circuits to receive a respective upstream one of the plurality of analog added signals and provide a respective downstream one of the plurality of analog integrated signals;

analog-to-digital converter (ADC) circuitry coupled to the last analog integrator circuit to receive a last one of the plurality of analog integrated signals and provide an N-bit digital signal; and digital signal processing (DSP) circuitry coupled between the ADC circuitry and the one or more output electrodes and programmed to:

add the N-bit digital signal and a last one of a plurality of digital integrated signals to provide a digital added signal;

truncate the digital added signal to provide the one or more digital output signals including an M-bit digital signal, wherein N>M;

truncate the M-bit digital signal and provide first and last ones of a plurality of truncated signals, provide corresponding first and last ones of a plurality of truncation error feedback signals, and provide corresponding first and last ones of a plurality of digital feedback signals, having M1 and M2 bits, respectively, wherein $M \geq M1$ and $M \geq M2$, the first one of the plurality of digital feedback signals comprises the first one of the plurality of truncated signals, and each one of the plurality of feedback truncation means downstream from the first feedback truncation means is further for combining an upstream one of the plurality of digital integrated signals with an associated one of the plurality of truncated signals to provide a respective downstream one of the plurality of digital feedback signals;

perform a plurality of digital integrations including first and last digital integrations, wherein the first digital integration integrates the first one of the plurality of truncation error feedback signals to provide a first one of the plurality of digital integrated signals, and each remaining one of the plurality of digital integrations integrates a respective upstream one of the plurality of truncation error feedback signals to provide a respective downstream one of the plurality of digital integrated signals; and perform a plurality of digital-to-analog (DA) conversions including first and last DA conversions to convert the plurality of digital feedback signals to provide the plurality of analog feedback signals.

DETAILED DESCRIPTION

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

Figure 1:
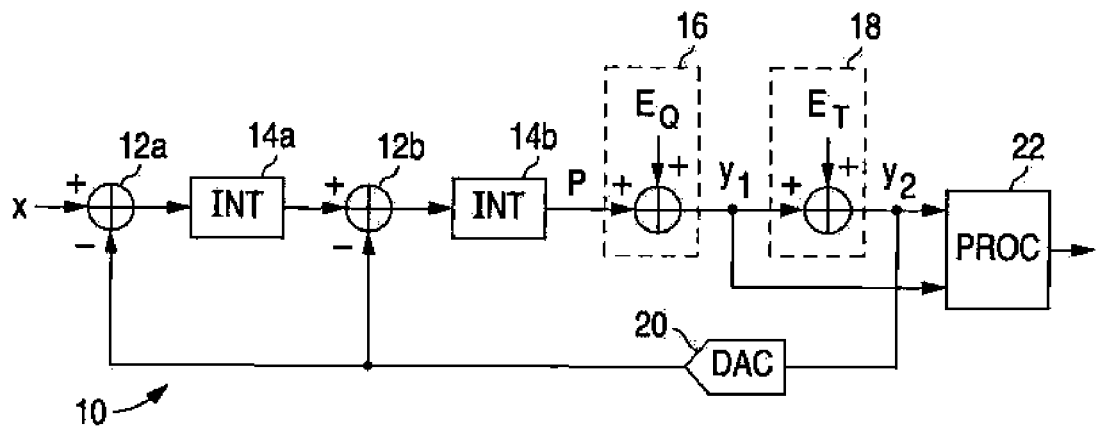
FIG. 1 is a functional block diagram of a second order sigma-delta modulator using a conventional DAC resolution reduction technique.
Figure 2:
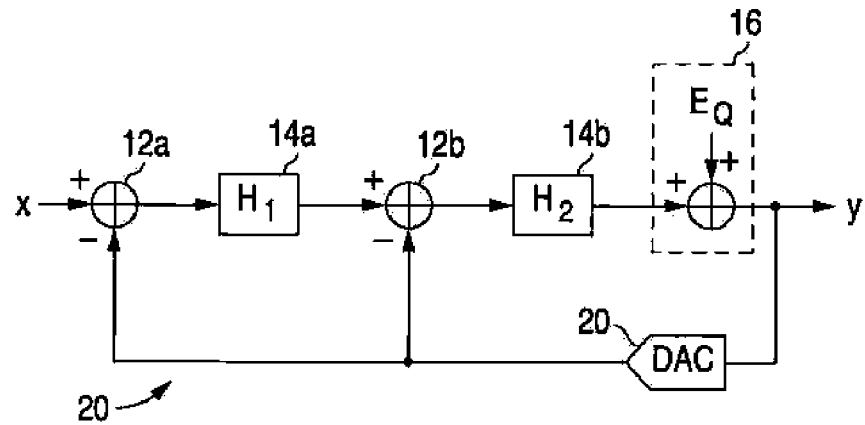
FIG. 2 is a functional block diagram of a conventional second order sigma-delta modulator.

Referring to FIG. 2, in a conventional second order sigma-delta modulator 20, the usual equations describing its operation are as follows:

$$\{(x-y)H_1-y\}H_2+\epsilon_Q=y \tag{7}$$

$$y=x^*z^{-1}+\epsilon_Q(1-z^{-1})^2 \tag{8}$$

For an N-bit quantizer 16, the word length of its output signal y is N-bits and it adds a quantization error $\epsilon_Q$ caused by the N-bit quantization. When the output y is reduced from N-bits to M-bits, this corresponds to the injection of an additional noise in the form of truncation noise $\epsilon_T$ due to the truncation operation that reduces the resolution from N-bits to M-bits as if the modulator 20 used an M-bit quantizer.

Figure 3A:
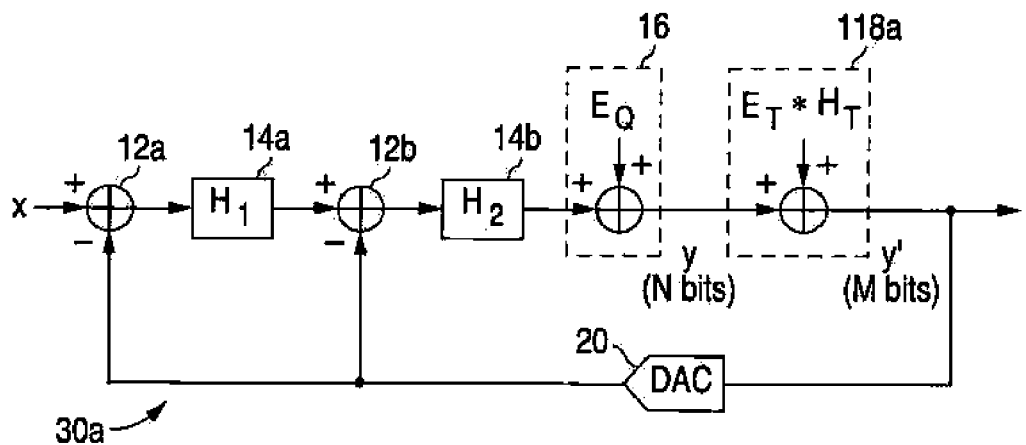
FIG. 3A is a functional block diagram using a DAC resolution reduction technique in accordance with one embodiment of the presently claimed invention.

Referring to FIG. 3A, in accordance with the presently claimed invention, it is intended to retain the benefit of the higher N-bit quantization by processing the truncation error $\epsilon_T$ in accordance with a filtering function $H_T$, thereby introducing a processed truncation error $\epsilon_T^*H_T$ rather than the conventional truncation error $\epsilon_T$. The truncated output signal y' has a shorter word length of M-bits, and the operation of this modulator 30a can be expressed as follows:

$$\{(x-y')H_1-y'\}H_2+\epsilon_Q+\epsilon_TH_T=y' \tag{9}$$

$$y=x^*z^{-1}+(\epsilon_Q+\epsilon_TH_T)(1-z^{-1})^2 \tag{10}$$

The filter transfer functions H1, H2 as respective functions of z are not specified here with particularity since a number of types of integrators (e.g., with and without delays as desired) can be used in accordance with the presently claimed invention. Nonetheless, it will be readily appreciated by one of ordinary skill in the art that Equation (10) is derived from Equation (9).

From these equations, it can be seen that the truncation error $\epsilon_T$ is shaped by the same transfer function as the quantization error $\epsilon_Q$, but is also filtered by the filtering function $H_1$. Filtering the truncation error $\epsilon_T$ with a moderate high pass component is enough because, as shown by equation (10), the modulator already provides a shaping equal to the order of the modulator. The order of the extra shaping depends on the specific truncation level used.

While the modulator 30a of FIG. 3A is depicted as being of second order with first 12a and last 12b adders and first 14a and last 14b integrators, it will be readily appreciated by one of ordinary skill in the art that a first order modulator can also be implemented in accordance with the presently claimed invention. Such a sigma-delta modulator would include one adder (therefore both the first and last adder) and one integrator (therefore both the first and last integrator).

Figure 3B:
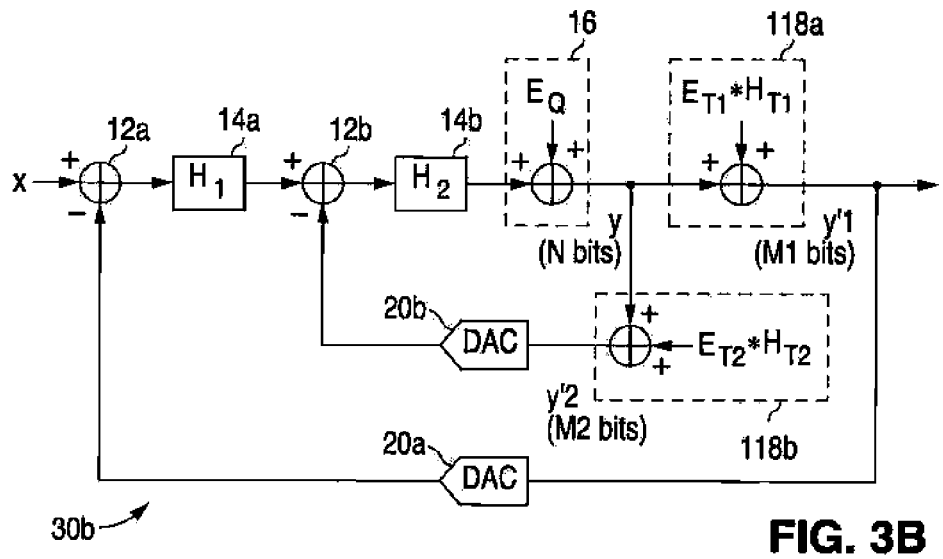
FIG. 3B is a functional block diagram using a DAC resolution reduction technique in accordance with another embodiment of the presently claimed invention.

In the modulator 30a of FIG. 3A, all M bits of the truncated output signal y' are shown as being converted and provided as the same feedback signal to each of the adders 12a, 12b. However, referring to FIG. 3B, it will be readily appreciated by one of ordinary skill in the art that an additional output truncation circuit 118b can be used to provide multiple truncated output signals with a different number of quantization bits, which are converted by a corresponding feedback DAC for summing in a respective one of the adders. For example, in the second order modulator 30b of FIG. 3B, the first output truncation circuit 118a provides truncated output signal y'1 with M1 quantization bits while a second output truncation circuit 118b provides a second truncated output signal y'2 with M2 quantization bits, each of which is converted by its own corresponding feedback DAC 20a, 20b for summing in adders 12a and 12b, respectively. As a result, the truncation error $\epsilon_{T1}^*H_{T1}$ injected at the first output truncation circuit 118a is shaped with an order equal to that of the modulator, while the truncation error $\epsilon_{T2}^*H_{T2}$ injected at the second output truncation circuit 118b is shaped by a lower order.

Figure 4:
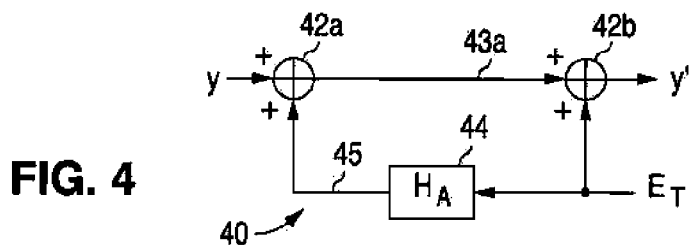
FIG. 4 is a functional block diagram of one example embodiment of the truncation filter for the truncation circuit of FIG. 3A.

Referring to FIG. 4, since the truncation error $\epsilon_T$ is a signal in the digital domain, it can be processed by filtering with a filtering function $H_A$ 44, with the filtered result 45 summed with the quantized signal y, the result 43a of which is further summed with the truncation error $\epsilon_T$ to produce the truncated output signal y'.

It can be seen by inspection that the output signal y' can be expressed as follows:

$$y+H_A\epsilon_T+\epsilon_T=y' \tag{11}$$

Solving this for the truncation error filtering function $H_A$ produces the following:

$$H_A=H_T-1 \tag{12}$$

By way of example, if it is desired to provide an extra second order shaping, the truncation error filtering function $H_T$ can expressed be as follows:

$$H_T=(1-z^{-1})^2 \tag{13}$$

As a result, the internal filtering function $H_A$ will be:

$$H_A=-2z^{-1}+z^{-2} \tag{14}$$

As should be recognized from this example, other implementations of filtering can be used for processing the truncation error $\epsilon_T$, including the introduction of additional zeroes in the z-plane at z=1. Additionally, zeroes can be introduced at other points of the z-plane for optimizing the dynamic range of the operational amplifiers used in the sigma-delta modulator. For example, it may be desirable to have a zero at z=1 and two complex conjugate zeros at less than (e.g., ⅔ of) the Nyquist frequency. As a result, the truncation error filtering function $H_T$ can expressed be as follows:

$$H_T(Z)=(1-z^{-1})^*(1+z^{-1}+z^{-2})=1-z^{-3} \tag{15}$$

Accordingly the feedback filtering function $H_A$ becomes a simple delay $-z^{-3}$.

Figure 5A:
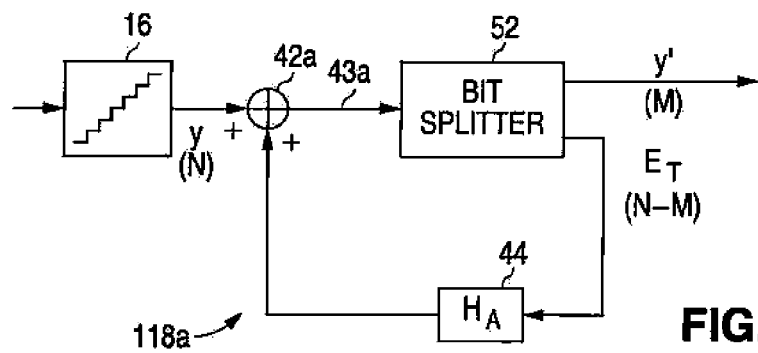
FIG. 5A is a functional block diagram of one example embodiment of the truncation circuit of FIG. 3A.

Referring to FIG. 5A, one example embodiment 118a of the truncation stage includes a bit splitter circuit 52 (which can be implemented in accordance with well-known techniques), the internal filtering function 44 and the summation circuitry 42, interconnected substantially as shown. The quantized signal y from the quantizer 16 is received, summed with the filtered truncation error $\epsilon_T$, and split by the bit splitter circuit 52. The (N–M)-bit truncation error $\epsilon_T$ is filtered by the filter circuit 44 (e.g., a simple delay $-z^{-3}$, as discussed above) for summing with the N-bit quantizer signal.

Figure 5B:
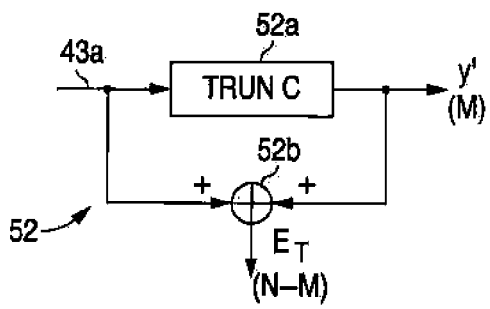
FIG. 5B is a functional block diagram of one example embodiment of the bit splitter circuit of FIG. 5A.

Referring to FIG. 5B, one example embodiment of the bit splitter circuit 52 of FIG. 5A includes a truncation circuit 52a and adder 52b interconnected substantially as shown. The M-bit truncated output signal y' is differentially summed with the N-bit input signal 43 to produce the truncation error $\epsilon_T$.

Based upon the foregoing discussion, it should be recognized that a number of significant benefits are provided by a DAC resolution reduction technique in accordance with the presently claimed invention. One benefit is a reduction in the word length of the output signal y', which simplifies the internal feedback DAC (due to the reduced feedback word length), as well as further processing downstream (e.g., simplifying the first stage of the decimation filter). A second benefit is minimum additional processing in the form of the truncation error filtering function HA. A third benefit is the shaping of the truncation error $\epsilon T$ by a noise transfer function having an order increased by the order of the truncation filtering function HA over the order of the host sigma-delta modulator, thereby minimizing, if not eliminating, a need for cancellation of the error. (For example, with a second order sigma-delta modulator and a k-order truncation error filtering function HA, the truncation error $\epsilon T$ is shaped by a noise transfer function having an order of 2+k.) This last benefit is fully realized when the same truncated output signal y' is fed back as in the circuitry of FIG. 3A; however, when differently truncated output signals y'1, y'2 are fed back as in the circuitry of FIG. 3, the second truncated output signal y'2 will experience a lower order shaping.

More particularly, with the presently claimed invention, the minimum modulator need only be first order, unlike the prior art (see, e.g., U.S. Pat. No. 6,980,144) which also requires the digital truncation to be of an order higher than that of the modulator (e.g., a second order modulator would require a digital truncation of at least third order). Indeed, in accordance with the presently claimed invention, additional zeros at frequencies other than zero (i.e., z=0) can be introduced as desired, e.g., to further reduce noise outside of the signal band.

Further, modulator designs of third order or higher often suffer from problems with circuit stability, and are generally matched with a lower order digital truncation (see, e.g., U.S. Pat. No. 6,967,608). For example, with a second order modulator and a second order truncation, the quantization error and truncation error are shaped with the same function and appear in the output with similar weights. With the truncation error higher than the quantization, the SNR is dominated by the truncation error, with the result being that the output can appear to have a lower number of bits.

Prior techniques have sought to avoid using digital modulators with orders higher than two and zero delay by estimating the effect of the truncation error after the first analog integrator and to inject at the input of the second integrator a digital signal converted by a DAC for canceling the truncation error that was passed through the first analog integrator. Such a technique can be successful if the estimate of the transfer function of the first analog integrator is accurate. Such designs can be reasonably stable with a large number of truncated bits but tend to become unstable with fewer truncated bits. Also, limitations exist due to mismatches among the various capacitors and finite gain or slew-rate of the operational amplifier which cause the transfer function of the first integrator to be different from the ideal z−1/(1−z−1) or 1/(1−z−1), with Such difference tending to reduce the effects of the cancellation. In contrast thereto, as noted above, a modulator in accordance with the presently claimed invention is not affected by stability issues because a lower order modulator (e.g., second order) can be used while still benefiting from the truncation error filter, i.e., resulting in k+2-order digital shaping for a second order modulator with a k-order truncation error filter.

Figure 6:
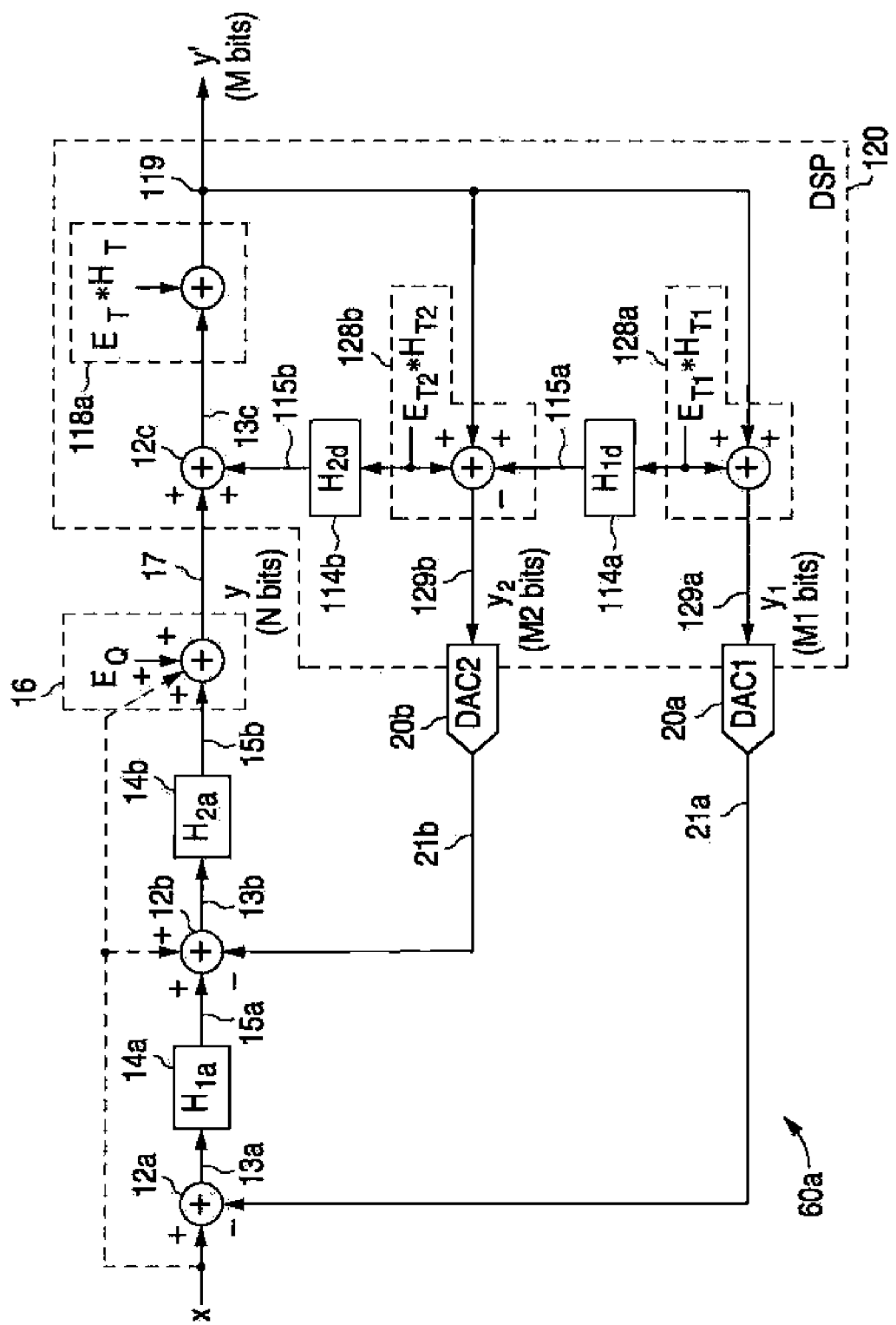
FIG. 6 is a functional block diagram of a second order sigma-delta modulator using a DAC resolution reduction technique in accordance with another embodiment of the presently claimed invention.

Referring to FIG. 6, in addition to the output signal truncation circuitry 118a, additional truncation circuitry 128a, 128b can be used, along with digital integration circuits 114a, 114b, to provide increased tolerance of non-ideal operating characteristics of the analog integration circuits 14a, 14b. (In accordance with a preferred embodiment, the digital circuits 12c, 118a, 128a, 114a, 128b, 114b are implemented in the form of a digital signal processing (DSP) circuit 120, which is well known in the art.) In accordance with an alternative embodiment, the incoming analog signal x can also be fed forward to the second adder 12b as well as the quantizer 16, thereby reducing signal gain requirements within the integration circuits 14a, 14b.

In accordance with a preferred embodiment of this sigma-delta modulator 60a, the truncated output signal y', which is provided to the downstream decimation filter, has M bits, as discussed above, while the further truncated signals y1 and y2 have M1 and M2 bits, respectively, such that N>M, M≧M1, M≧M2, and preferably M2≧M1.

In accordance with this system architecture, the output signal S13b of the second adder 12b, in terms of the output signals S21a, S21b of the feedback DACs 20a, 20b could be expressed as follows.

$$S13b = H1a*(x-S21a) - S21b \tag{16}$$

In terms of the digital input signals y1, y2 to the DACs 20a, 20b, this can be written as follows.

$$S13b = H1a*(x-y_1) - y_2 \tag{17}$$

Further expanded in terms of the filtered truncation signals and the analog and digital integrator transfer functions, this can be written as follows.

$$S13b = H1a*(x-y') - y' + E_{T1}*H_{T1}*(H1d - H1a) - E_{T2}*H_{T2} \tag{18}$$

Solving this for the output signal y', this becomes:

$$y' = \frac{x*H1a*H2a}{1+H1a*H2a+H2a} + \frac{E_{T1}*H_{T1}*H2a*(H1d-H1a)}{1+H1a*H2a+H2a} + \frac{E_{T2}*H_{T2}*(H2d-H2a)}{1+H1a*H2a+H2a} + \frac{E_Q + E_T*H_T}{1+H1a*H2a+H2a} \tag{19}$$

If the transfer functions of the corresponding analog 14a, 14b and digital 114a, 114b integrators are substantially equal, i.e., H1a is ≈H1d and H2a≈H2d, then this simplifies to the following:

$$y' \approx \frac{x*H1a*H2a}{1+H1a*H2a+H2a} + \frac{E_Q + E_T*H_T}{1+H1a*H2a+H2a} \tag{20}$$

If the filter function $H_T$ is chosen such that within the signal bandwidth of interest the equalization error $E_Q$ is much greater than the filtered truncation error $E_T*H_T$ ($E_Q$>>$E_T*H_T$), then this can be further approximated as follows.

$$y' \approx \frac{x*H1a*H2a}{1+H1a*H2a+H2a} + \frac{E_Q}{1+H1a*H2a+H2a} \tag{21}$$

Figure 6A:
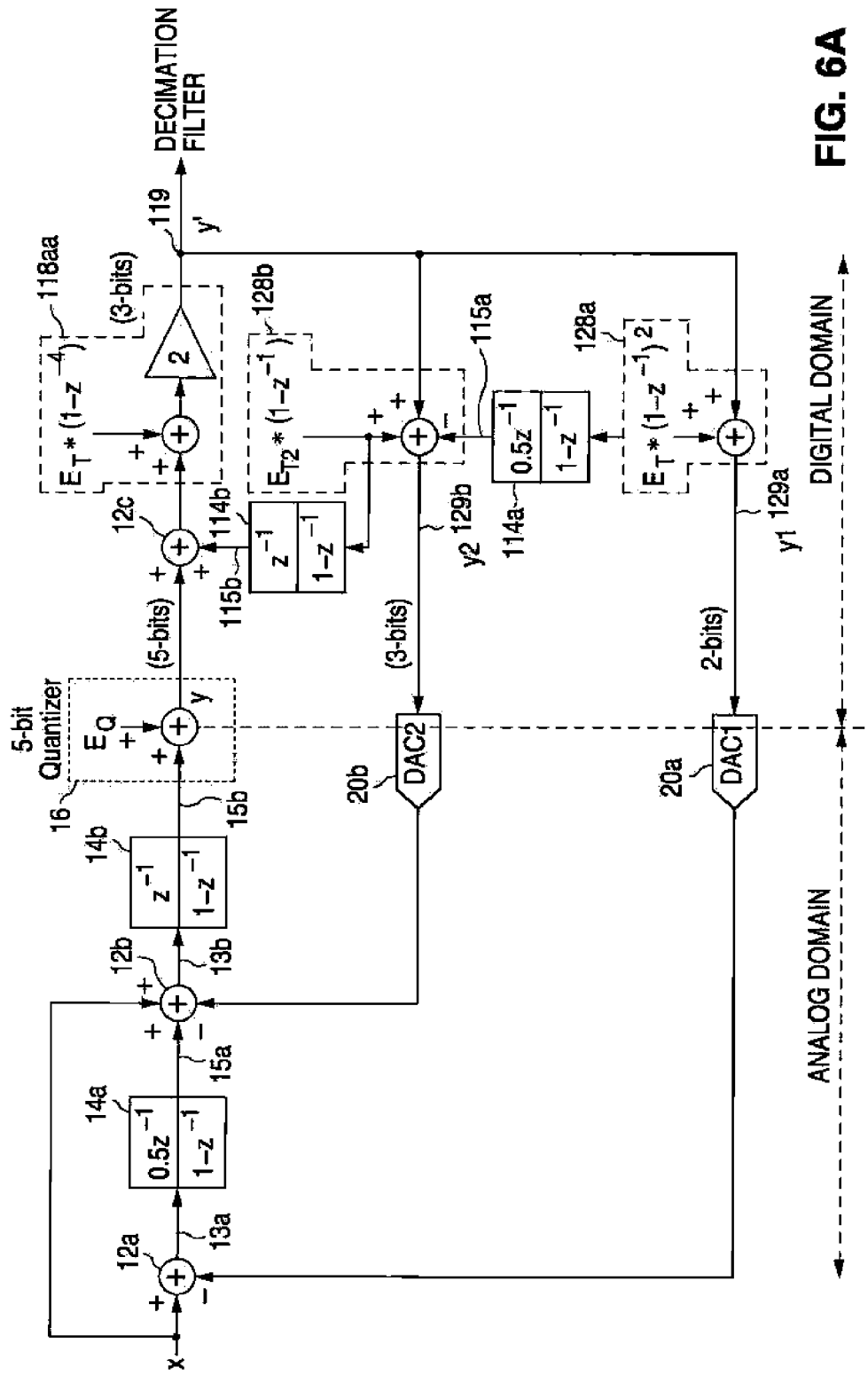
FIG. 6A is a functional block diagram of an example embodiment of the second order sigma-delta modulator of FIG. 6.

Referring also to FIG. 6A, in accordance with one example embodiment, the output quantizer 16 was implemented as a 5-bit quantizer and an oversampling ratio (OSR) of 128, output signal y' had three bits, feedback signals y1 and y2 had two and three bits, respectively, and the output truncation error filter $H_T$ and denominator terms of equation 21 were selected as follows.

$$H_T = 1 - z^{-4} \ \& \ \frac{1}{1 + H1a * H2a + H2a} = 2*(1-z^{-1})^2 \quad (22)$$

As a result, equation 20 becomes:

$$y' \approx x + 2*(1-z^{-1})^2 * E_Q - 2*(1-z^{-1})^3 * (1+z^{-2}) * (1+z^{-1}) * E_T \quad (23)$$

In order to minimize the effects of the truncation error $E_T$ within the signal bandwidth as compared to the quantization error $E_Q$, i.e., so the transfer function within the signal bandwidth can be approximated according to equation 21, the order of the noise shaping of the truncation error $E_T$ must be greater than the order of the noise shaping of the quantization error $E_Q$. With reference to the truncation error $E_T$ term in equation 23, it can be seen that this criteria is met. First, it can be seen that this term has three zeros at DC, which minimize the truncation error $E_T$ relative to the quantization error $E_Q$ within the signal bandwidth. Second, this term also has two complex conjugate zeros at one-fourth of the sampling frequency (Fs/4), and a zero at one-half of the sampling frequency (Fs/2, i.e., the Nyquist frequency), which further attenuate the truncation error $E_T$, thereby reducing the required signal range of the quantizer 16.

Another advantage of the architecture of such sigma-delta modulators 60a is the ability to compensate for mismatches between the transfer functions of the corresponding analog 14a, 14b and digital 114a, 114b integration circuits. (In accordance with a preferred embodiment, corresponding transfer functions of the analog 14a, 14b and digital 114a, 114b integration circuits are at least approximately equal, i.e., the first analog 14a and digital 114a integration circuit transfer functions are at least approximately equal, the second analog 14b and digital 114b integration circuit transfer functions are at least approximately equal, etc. However, depending upon the desired operating characteristics or system requirements, such approximate equalities among corresponding transfer functions may not be sufficient.) When their functions are not equal, i.e., $H1a \neq H1d$ and $H2a \neq H2d$, the terms within equation 19 containing the truncation errors $E_{T1}$, $E_{T2}$ cannot be disregarded since the differences between the respective transfer functions, i.e., $H1a - H1d$ and $H2a - H2d$, are nonzero. However, equation 19 within the signal bandwidth of interest can be approximated by equation 21 if we can achieve the following relationships between the quantization error $E_Q$ and truncation errors $E_{T1}$, $E_{T2}$:

$$E_Q \gg H_{T1} * H_{T2} * (H1d - H1a) * E_{T1} \quad (24)$$

$$E_Q \gg H_{T2} * (H2d - H2a) * E_{T2} \quad (25)$$

Outside the signal bandwidth of interest, filters can be used to reduce errors in the digital domain.

For example, mismatches between the analog 14a, 14b and digital 114a, 114b integrators can result from mismatches among the capacitors used to establish the integrators signal gain, as well as finite signal gains within the operational amplifiers which can cause integrator leakage.

Referring back to equation 22, the mismatches between the analog and digital integrator transfer functions can be expressed as follows:

$$H1d - H1a = E_1 * H1a \ \& \ H2d - H2a = E_2 * H2a \quad (26)$$

Substituting these into equation 19 produces the following expressions:

$$y' \approx x + H_{T1} * E_1 * E_{T1} + 2*(1-z^{-1})*H_{T2}*E_2*E_{T2} + 2* \\ (1-z^{-1})^2 * E_Q - 2*(1-z^{-1})^3 *(1+z^{-2})*(1+z^{-1})*E_T \quad (27)$$

$$y' \approx x + H_{T1}*E_1*E_{T1} + 2*(1-z^{-1})*H_{T2}*E_2*E_{T2} + 2* \\ (1-z^{-1})^2 * E_Q \quad (28)$$

Focusing on the signal bandwidth of interest, i.e.:

$$y' \approx x + 2*(1-z^{-1})^2 * E_Q \quad (29)$$

Yields the following relationships:

$$2*(1-z^{-1})^2 * E_Q \gg H_{T1}*E_1*E_{T1} \quad (30)$$

$$2*(1-z^{-1})^2 * E_Q \gg 2*(1-z^{-1})*H_{T2}*E_2*E_{T2} \quad (31)$$

$$(1-z^{-1})*E_Q \gg H_{T2}*E_2*E_{T2} \quad (32)$$

From these expressions, the following general relationships can be seen:

$$H_{T1} = (1-z^{-1})^n, \ n \geq 2 \quad (33)$$

$$H_{T2} = (1-z^{-1})^m, \ m \geq 1 \quad (34)$$

Accordingly, for an Nth order sigma-delta modulator, the orders of noise shaping for the truncation filters should be as follows:

$$H_{T1} : \geq N, \ H_{T2} : \geq N-1, \ H_{T3} : \geq N-2, \ldots \quad (35)$$

As should be readily understood, as depicted in FIGS. 6 and 6A, the digital circuitry 128b providing truncation for the second feedback loop (as well as any similar such circuitry further downstream for additional feedback loops in the case of higher order SDMs) includes an adder for combining the truncated signal with the upstream digital integrated signal 115a (e.g., differentially summing in which the upstream digital integrated signal 115a is subtracted from the truncated signal).

Figure 7:
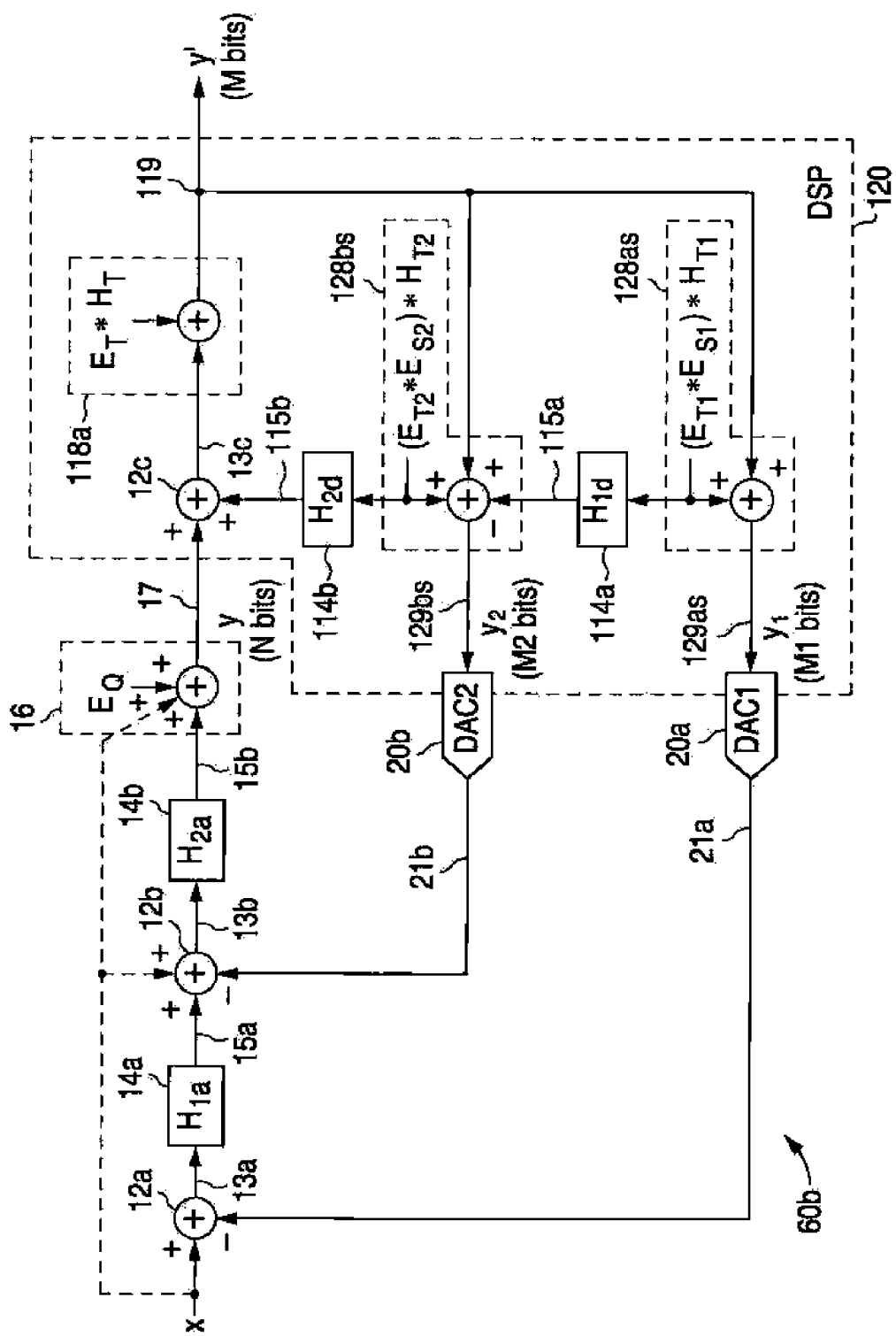
FIG. 7 is a functional block diagram of a second order sigma-delta modulator using a DAC resolution reduction technique in accordance with another embodiment of the presently claimed invention.

Referring to FIG. 7, a sigma-delta modulator 60b in accordance with another embodiment of the presently claimed invention provides for effectively extending the dynamic range by compensating for saturation errors. As is well known, noise includes quantization noise, truncation noise and noise from other non-ideal operating characteristics, and when added to the maximum expected signal can result in saturation. Further, such saturation errors can be inconsistent since every integrator will have an at least slightly different maximum signal range. Accordingly, the truncation circuits 128as, 128bs in the feedback loops also include saturation protection circuitry. These circuits 128as, 128bs provide truncation, i.e., removal of one or more of the least significant bits (LSBs), plus saturation protection by removing one or more of the most significant bits (MSBs). The associated truncation $E_{T1}$, $E_{T2}$ and saturation $E_{S1}$, $E_{S2}$ errors are summed and integrated before being carried over to the next feedback stage for compensation, as shown.

Figure 8A:
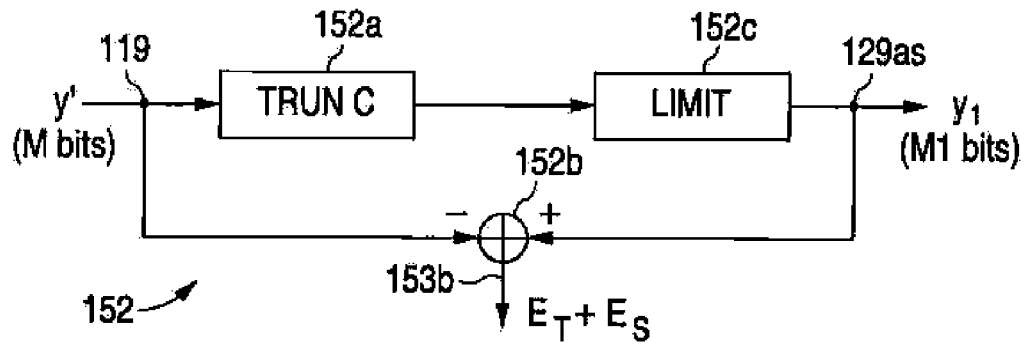
FIGS. 8A, 8B and 8C are functional block diagrams of example embodiments of the truncation and saturation protection circuitry of FIG. 7.
Figure 8B:
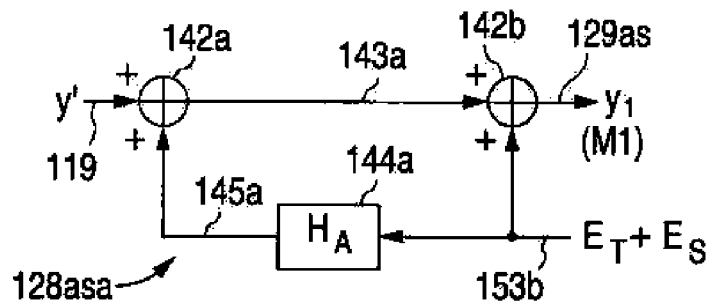
Figure 8C:
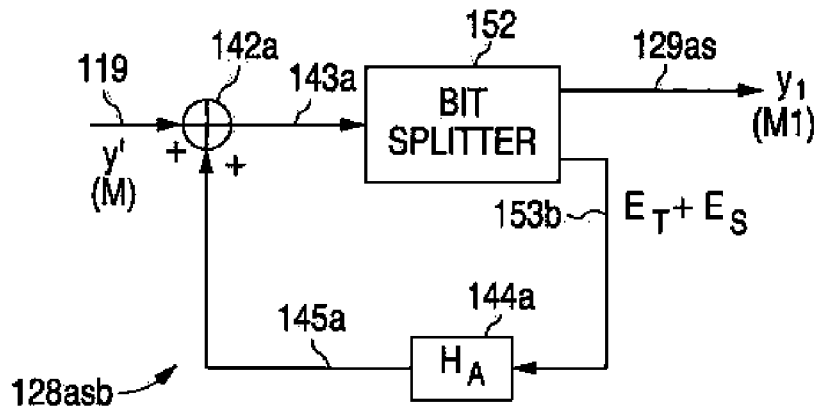

Referring to FIGS. 8A, 8B and 8C, using the first truncation and saturation protection circuit 128as as an example, truncation and saturation protection can be implemented as shown. As shown in FIG. 8A, similar to the circuitry of FIG. 5B, the bit splitter circuit 152 includes a truncation circuit 152a (to truncate one or more LSBs) and adder 152b plus a limiter (to truncate one or more MSBs) interconnected substantially as shown. The M1-bit truncated output signal $y_1$ is differentially summed with the M-bit input signal y' 119 to produce the truncation and saturation error $E_T + E_S$ 153b. The circuits 128asa, 128asb of FIGS. 8B and 8C operate in a manner similar to those as described above for FIGS. 4 and 5A, but with the additional operation of saturation protection by the removal of one or more MSBs, as discussed above.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a multiple order sigma-delta modulator, comprising:
    an input electrode to convey an analog input signal;
    one or more output electrodes to convey one or more digital output signals;
    a plurality of analog adder circuits including first and last analog adder circuits, wherein said first analog adder circuit is coupled to said input electrode to receive said analog input signal and a first one of a plurality of analog feedback signals and provide a first one of a plurality of analog added signals, and each remaining one of said plurality of analog adder circuits is to receive a respective upstream one of a plurality of analog integrated signals and a respective additional one of said plurality of analog feedback signals and provide a respective downstream one of said plurality of analog added signals;
    a plurality of analog integrator circuits including first and last analog integrator circuits, wherein said first analog integrator circuit is coupled to said first analog adder circuit to receive said first one of said plurality of analog added signals and provide a first one of said plurality of analog integrated signals, and each remaining one of said plurality of analog integrator circuits is coupled to a respective upstream one of said plurality of analog adder circuits to receive a respective upstream one of said plurality of analog added signals and provide a respective downstream one of said plurality of analog integrated signals;
    analog-to-digital converter (ADC) circuitry coupled to said last analog integrator circuit to receive a last one of said plurality of analog integrated signals and provide an N-bit digital signal;
    a digital adder circuit coupled to said ADC circuitry to receive said N-bit digital signal and a last one of a plurality of digital integrated signals and provide a digital added signal;
    an output truncation circuit coupled between said digital adder circuit and said one or more output electrodes to receive said digital added signal and provide said one or more digital output signals including an M-bit digital signal, wherein N>M;
    a plurality of feedback truncation circuits coupled to said one or more output electrodes to receive said M-bit digital signal and including first and last feedback truncation circuits to provide first and last ones of a plurality of truncated signals, to provide corresponding first and last ones of a plurality of truncation error feedback signals, and to provide corresponding first and last ones of a plurality of digital feedback signals, having M1 and M2 bits, respectively, wherein $M \geq M1$ and $M \geq M2$, said first one of said plurality of digital feedback signals comprises said first one of said plurality of truncated signals, and
    each one of said plurality of feedback truncation circuits downstream from said first feedback truncation circuit is further to combine an upstream one of said plurality of digital integrated signals with an associated one of said plurality of truncated signals to provide a respective downstream one of said plurality of digital feedback signals;
    a plurality of digital integrator circuits including first and last digital integrator circuits, wherein said first digital integrator circuit is coupled to said first feedback truncation circuit to receive said first one of said plurality of truncation error feedback signals and provide a first one of said plurality of digital integrated signals, and each remaining one of said plurality of digital integrator circuits is coupled to a respective upstream one of said plurality of feedback truncation circuits to receive a respective upstream one of said plurality of truncation error feedback signals and provide a respective downstream one of said plurality of digital integrated signals; and
    a plurality of digital-to-analog converter (DAC) circuits including first and last DAC circuits to receive said plurality of digital feedback signals and provide said plurality of analog feedback signals.

2. The apparatus of claim 1, wherein said output truncation circuit comprises:
    adder circuitry to combine said digital added signal and a filtered signal and provide an input added signal;
    bit splitting circuitry coupled to said adder circuitry to receive said input added signal and provide said M-bit digital signal and an output truncation error signal; and
    filter circuitry coupled between said bit splitting circuitry and said adder circuitry to receive said output truncation error signal and provide said filtered signal.

3. The apparatus of claim 1, wherein at least one of said plurality of feedback truncation circuits comprises:
    adder circuitry to combine said M-bit digital signal and one of said plurality of truncation error feedback signals and provide an input added signal;
    bit splitting circuitry coupled to said adder circuitry to receive said input added signal and provide one of said plurality of truncated signals and a truncation error signal; and
    filter circuitry coupled between said bit splitting circuitry and said adder circuitry to receive said truncation error signal and provide said one of said plurality of truncation error feedback signals.

4. The apparatus of claim 1, wherein $M2 \geq M1$.

5. The apparatus of claim 1, wherein:
    said first and last analog integrator circuits have first and last analog integration transfer functions, respectively;
    said first and last digital integrator circuits have first and last digital integration transfer functions, respectively; and
    said first and last analog integration transfer functions are at least approximately equal to said first and last digital integration transfer functions, respectively.

6. An apparatus including a multiple order sigma-delta modulator, comprising:
    a plurality of analog adder means including first and last analog adder means, wherein said first analog adder means is for adding an analog input signal and a first one of a plurality of analog feedback signals to provide a first one of a plurality of analog added signals, and each remaining one of said plurality of analog adder means is for adding a respective upstream one of a plurality of analog integrated signals and a respective additional one of said plurality of analog feedback signals to provide a respective downstream one of said plurality of analog added signals;

a plurality of analog integrator means including first and last analog integrator means, wherein said first analog integrator means is for integrating said first one of said plurality of analog added signals to provide a first one of said plurality of analog integrated signals, and each remaining one of said plurality of analog integrator means is for integrating a respective upstream one of said plurality of analog added signals to provide a respective downstream one of said plurality of analog integrated signals;

analog-to-digital converter (ADC) means for converting a last one of said plurality of analog integrated signals to provide an N-bit digital signal;

digital adder means for adding said N-bit digital signal and a last one of a plurality of digital integrated signals to provide a digital added signal;

output truncation means for truncating said digital added signal to provide said one or more digital output signals including an M-bit digital signal, wherein N>M;

a plurality of feedback truncation means for truncating said M-bit digital signal and including first and last feedback truncation means for providing first and last ones of a plurality of truncated signals, for providing corresponding first and last ones of a plurality of truncation error feedback signals, and for providing corresponding first and last ones of a plurality of digital feedback signals, having M1 and M2 bits, respectively, wherein $M \geq M1$ and $M \geq M2$, said first one of said plurality of digital feedback signals comprises said first one of said plurality of truncated signals, and each one of said plurality of feedback truncation means downstream from said first feedback truncation means is further for combining an upstream one of said plurality of digital integrated signals with an associated one of said plurality of truncated signals to provide a respective downstream one of said plurality of digital feedback signals;

a plurality of digital integrator means including first and last digital integrator means, wherein said first digital integrator means is for integrating said first one of said plurality of truncation error feedback signals to provide a first one of said plurality of digital integrated signals, and each remaining one of said plurality of digital integrator means is for integrating a respective upstream one of said plurality of truncation error feedback signals to provide a respective downstream one of said plurality of digital integrated signals; and a plurality of digital-to-analog converter (DAC) means including first and last DAC means for converting said plurality of digital feedback signals to provide said plurality of analog feedback signals.

7. An apparatus including a multiple order sigma-delta modulator, comprising:

an input electrode to convey an analog input signal;

one or more output electrodes to convey one or more digital output signals;

a plurality of analog adder circuits including first and last analog adder circuits, wherein said first analog adder circuit is coupled to said input electrode to receive said analog input signal and a first one of a plurality of analog feedback signals and provide a first one of a plurality of analog added signals, and each remaining one of said plurality of analog adder circuits is to receive a respective upstream one of a plurality of analog integrated signals and a respective additional one of said plurality of analog feedback signals and provide a respective downstream one of said plurality of analog added signals;

a plurality of analog integrator circuits including first and last analog integrator circuits, wherein said first analog integrator circuit is coupled to said first analog adder circuit to receive said first one of said plurality of analog added signals and provide a first one of said plurality of analog integrated signals, and each remaining one of said plurality of analog integrator circuits is coupled to a respective upstream one of said plurality of analog adder circuits to receive a respective upstream one of said plurality of analog added signals and provide a respective downstream one of said plurality of analog integrated signals;

analog-to-digital converter (ADC) circuitry coupled to said last analog integrator circuit to receive a last one of said plurality of analog integrated signals and provide an N-bit digital signal; and digital signal processing (DSP) circuitry coupled between said ADC circuitry and said one or more output electrodes and programmed to:

add said N-bit digital signal and a last one of a plurality of digital integrated signals to provide a digital added signal;

truncate said digital added signal to provide said one or more digital output signals including an M-bit digital signal, wherein N>M;

truncate said M-bit digital signal and provide first and last ones of a plurality of truncated signals, provide corresponding first and last ones of a plurality of truncation error feedback signals, and provide corresponding first and last ones of a plurality of digital feedback signals, having M1 and M2 bits, respectively, wherein $M \geq M1$ and $M \geq M2$, said first one of said plurality of digital feedback signals comprises said first one of said plurality of truncated signals, and each one of said plurality of feedback truncation means downstream from said first feedback truncation means is further for combining an upstream one of said plurality of digital integrated signals with an associated one of said plurality of truncated signals to provide a respective downstream one of said plurality of digital feedback signals;

perform a plurality of digital integrations including first and last digital integrations, wherein said first digital integration integrates said first one of said plurality of truncation error feedback signals to provide a first one of said plurality of digital integrated signals, and each remaining one of said plurality of digital integrations integrates a respective upstream one of said plurality of truncation error feedback signals to provide a respective downstream one of said plurality of digital integrated signals; and perform a plurality of digital-to-analog (DA) conversions including first and last DA conversions to convert said plurality of digital feedback signals to provide said plurality of analog feedback signals.

* * * * *

UNITED STATES PATENT AND TRADEMARK OFFICE
CERTIFICATE OF CORRECTION

PATENT NO. : 7,522,079 B1
APPLICATION NO. : 11/850960
DATED : April 21, 2009
INVENTOR(S) : Jian-Yi Wu Page 1 of 1

It is certified that error appears in the above-identified patent and that said Letters Patent is hereby corrected as shown below:

Title Pg, Item (56), Other Publications, 2nd Item:
  after "Modulators with" please delete "Multilbit" and insert -- Multibit -- in its place.

Title Pg, Item (56), Other Publications, 4th Item:
  after "DAC" please delete "REsolution" and insert -- Resolution -- in its place.

Title Page, *Primary Examiner:*
  after "Linh" please delete "V" and insert -- V. -- in its place.

At Column 2, Line 26,
  after "The order of" please delete "sigma delta" and insert -- sigma-delta -- in its place.

At Column 8, Line 51,
  please delete "$H_T(Z) = (1-z^{-1}) * (1+z^{-1}+z^{-2}) = 1-z^{-3}$"
  and insert -- $H_T(z) = (1-z^{-1}) * (1+z^{-1}+z^{-2}) = 1-z^{-3}$ -- in its place.

Signed and Sealed this

Twenty-sixth Day of May, 2009

JOHN DOLL
*Acting Director of the United States Patent and Trademark Office*